United States Patent [19]

Bierschenk et al.

[11] Patent Number: 5,441,576
[45] Date of Patent: Aug. 15, 1995

[54] THERMOELECTRIC COOLER

[76] Inventors: James L. Bierschenk, 4805 Highgate La., Rowlett, Tex. 75088; Richard A. Howarth, 915 Spring Brook, Allen, Tex. 75002; Norbert J. Socolowski, 215 Fox Hill Rd., Denville, N.J. 07834-2507

[21] Appl. No.: 248,537

[22] Filed: May 24, 1994

Related U.S. Application Data

[63] Continuation-in-part of Ser. No. 11,869, Feb. 1, 1993, abandoned.

[51] Int. Cl.$^6$ .................................. H01L 35/08
[52] U.S. Cl. ........................... 136/203; 136/204; 136/224; 136/237
[58] Field of Search ............ 136/203, 204, 224, 225, 136/237

[56] References Cited

U.S. PATENT DOCUMENTS

| | | | |
|---|---|---|---|
| 3,225,549 | 12/1965 | Elfving | 62/3 |
| 3,249,470 | 5/1966 | Naake | 136/4 |
| 3,261,079 | 7/1966 | Clingman, Jr. et al. | 29/155.5 |
| 3,309,881 | 3/1967 | Beerman | 62/3 |
| 3,650,844 | 3/1972 | Kendall, Jr. et al. | 136/237 |
| 3,837,818 | 9/1974 | Happ et al. | 29/196.3 |
| 4,005,454 | 7/1977 | Froloff et al. | 357/65 |
| 4,797,328 | 1/1989 | Boehm et al. | 428/621 |
| 4,855,810 | 8/1989 | Gelb et al. | 357/87 |
| 5,040,381 | 8/1991 | Hazen | 62/3.2 |
| 5,229,070 | 7/1993 | Melton et al. | 420/557 |

OTHER PUBLICATIONS

"The MJ Resaearch Notebook", vol. II, No. 16, Autumn, 1992, p. 1.
Leong, et al "Finite-Element Thermal Stress Analysis of a Thermoelectric Cooler" Third International Conference on the Thermoelectric Energy Conversion, UTA, Mar. 12–14, 1980, IEEE Catalog No. 80CH1546-1 Reg 5, pp. 86–91.
"Literature related to module strength" Tel Tec Report, 1980–1990, pp. 1–3.
"Thermocycler", MJ Research, Inc. Copyright 1989, pp. 1–3.

Primary Examiner—Donald P. Walsh
Assistant Examiner—Chrisman D. Carroll
Attorney, Agent, or Firm—Baker & Botts

[57] ABSTRACT

A thermoelectric heat pump which is resistant against thermal stresses incurred during thermal cycling of Thermal Cyclers or the like between cold and hot temperatures of about 0° C. at a ramping rate up to about 1° C. per second has improved joints between the thermoelements and electrical conductors which have low electrical resistance and which substantially reduce fractures during thermal cycling. The joints include a tin-silver-indium solder containing by weight about 95% tin, 3.5% silver, and 1.5% indium, or a tin-silver-cadmium solder containing by weight about 95.5% tin, 3.5% silver, and 1.0% cadmium. A robust nickel diffusion barrier between the joints and thermoelectric elements ends provides additional improvement against joint fracture.

5 Claims, 2 Drawing Sheets

THERMOELECTRIC COOLER

This application is a continuation-in-part, of application Ser. No. 08/011,869, filed Feb. 1, 1993, now abandoned.

BACKGROUND OF THE INVENTION

In the past, thermal cyclers utilized resistive heaters to heat a liquid and a compressor to cool the liquid. To eliminate the need for external compressors or water sources, thermoelectric heat pumps were experimentally used to alternately cool and heat thermoconductive blocks. The use of thermoelectric heat pumps at first proved to be unreliable under thermal cycle extremes. Recent developments in thermoelectric heat pumps have extended the reliability of the thermoelectric cooler devices, but their relatively short mean time before thermal stress induced failure increased their cost of use. Thus, thermal cyclers using water cooled units became available for those who require long term device reliability for applications which do not require very low temperatures, and thermoelectric heat pump thermal cyclers became available for those who prefer the stand alone feature of Peltier units (heat pumps) and for those who work at temperatures below 15° C. Peltier junction heat pumps provide rapid heat transfer to and from a sample holding block with ramping rates up to 1° C. per second within a 0°–100° C. temperature range. Programmable controllers have been added to the thermoelectric heat pump thermal cyclers cooling of RNA and DNA.

The problem with known thermal cycler devices using thermoelectric coolers is their low mean time to stress failure which increases their life cycle cost effectiveness.

Typically, thermoelectric heat pumps, or coolers, or modules, as they are often referred to in common parlance cannot withstand the high thermally induced stresses when the cooler is repeatedly cycled from heating to cooling as required, for example, in applications for DNA replication and duplication. In such applications, the sample vials are in contact with one side of the thermoelectric cooler which is cooled by applying a positive voltage. After reaching the desired cold temperature at a preselected ramp rate, the polarity of the voltage is reversed and the sample viles are heated to temperatures as high as 100° C. at the preselected ramp rate. The process, or cycle, is then repeated until a sufficient size sample of target modules sufficient size is produced for DNA testing. As a result of the thermally induced stresses, thermoelectric elements (legs) of the cooler soon break loose from the soldered conductor pads and create high resistance joints within the cooler. In some cases, the thermoelectric elements move off their conductive pads to short with adjacent thermoelements. This failure is the principal contributor to the low mean time between failure of these devices.

SUMMARY OF THE INVENTION

Accordingly, the principal object of the invention is to improve the value of the mean time to failure of thermoelectric thermal cyclers.

Another object of the invention is to provide a thermoelectric heat pump capable of withstanding for a substantially increased period of time the high thermal stresses induced when the cooler is repeatedly cycled from heating to cooling.

Briefly stated, the invention provides a thermal cycler with a new and improved thermoelectric device of the type which provides cooling and heating cycles repeatedly for temperature cycle applications. The thermoelectric device exhibits both improved structural integrity and improved efficiency sufficient to maximize the mean time to failure of the thermal cycler. The new thermoelectric device includes a plurality of different type thermoelectric legs, or elements; a thermomechanical fatigue resisting bonding means on opposite respective sides of the thermoelectric legs, a plurality of conductive tab means attached to the bonding means to connect the legs in series to form a plurality of series connected thermocouples, and insulator means connected to the conductive tab means to prevent shorts when the thermoelectric cooler is connected to a medium for thermal cycling. The conductive tab means includes a conductive connector, e.g., copper, with or without a diffusion barrier interposed between the connector tab and bonding means.

In one embodiment, the bonding structure is a tin-silver-indium solder and in a second embodiment, the bonding structure is a tin-silver-cadmium solder.

BRIEF DESCRIPTION OF THE DRAWINGS

Other objects and features of the invention will become more readily apparent from the following detailed description when read in conjunction with the accompanying drawings, in which.

DETAILED DESCRIPTION OF THE INVENTION

Figure 1:
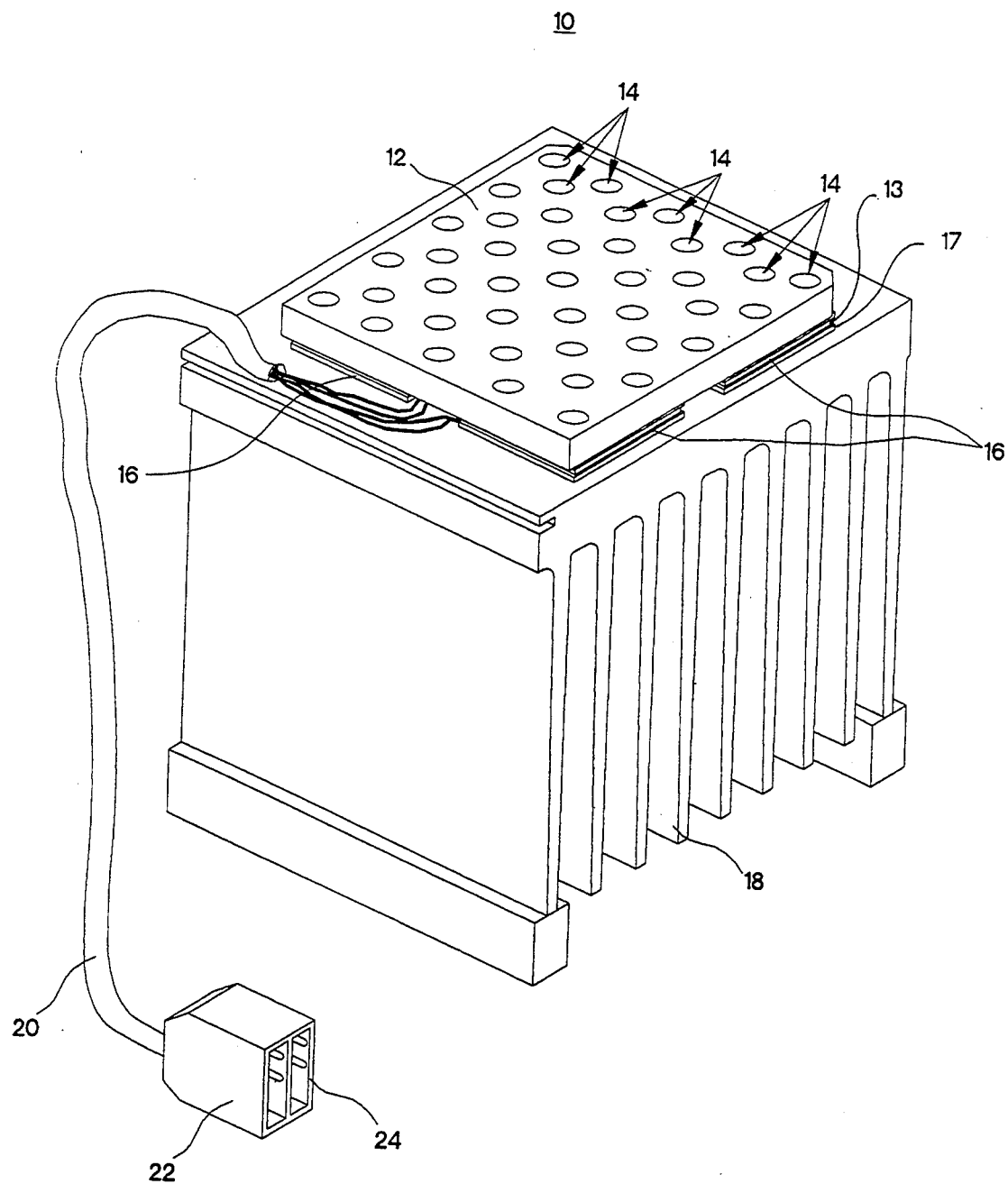
FIG. 1 is an isometric view of a typical thermoelectric cycler.

Referring now to FIG. 1, a typical thermo cycler 10 includes a sample box 12 having a plurality of wells 14 for vials (not shown) or the like. The sample box 12 is attached to a first surface 13 of one or more thermoelectric heat pumps 16. If more than one heat pump is required, they are connected in either series or parallel to a source of power. The thermoelectric heat pumps 16 have second surfaces 17 connected to a heat sink 18. Leads 20 connect the thermoelectric heat pumps 16 to a power supply 22 and a microprocessor controller 24.

Figure 2:
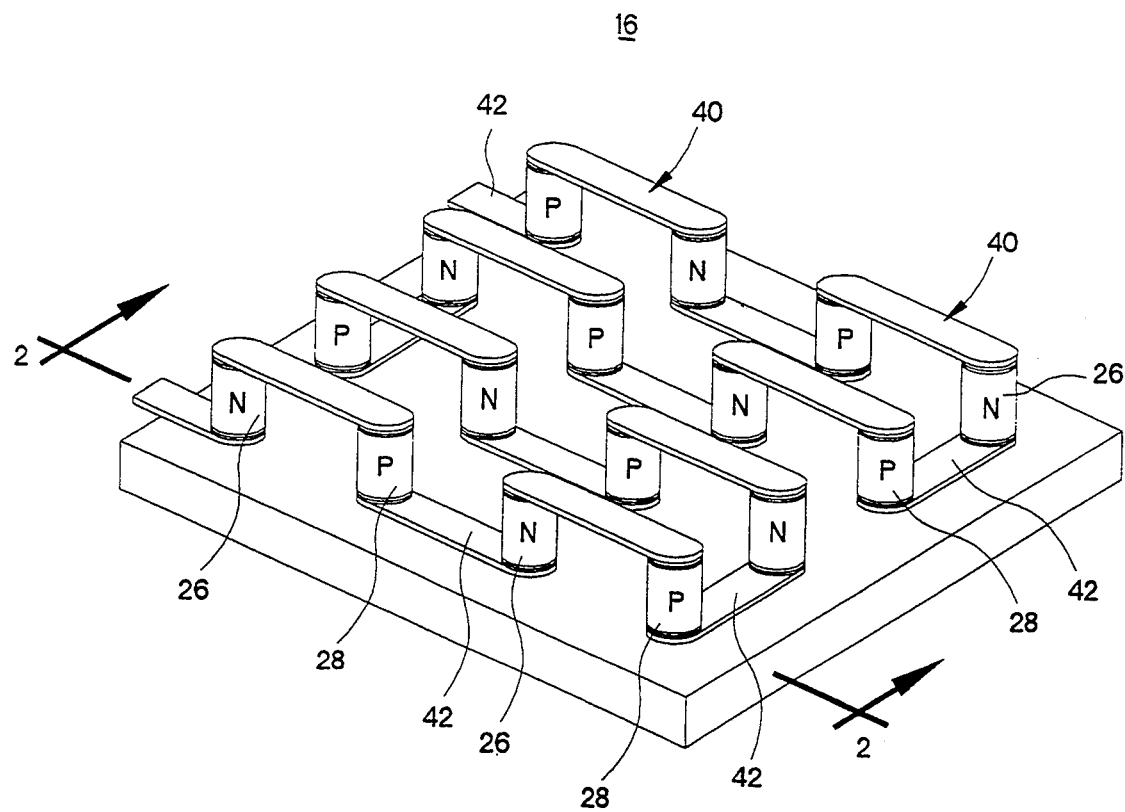
FIG. 2 is an isometric view of the device of FIG. 1 with portions removed for showing clearly the thermoelectric heat pump thereof.
Figure 3:
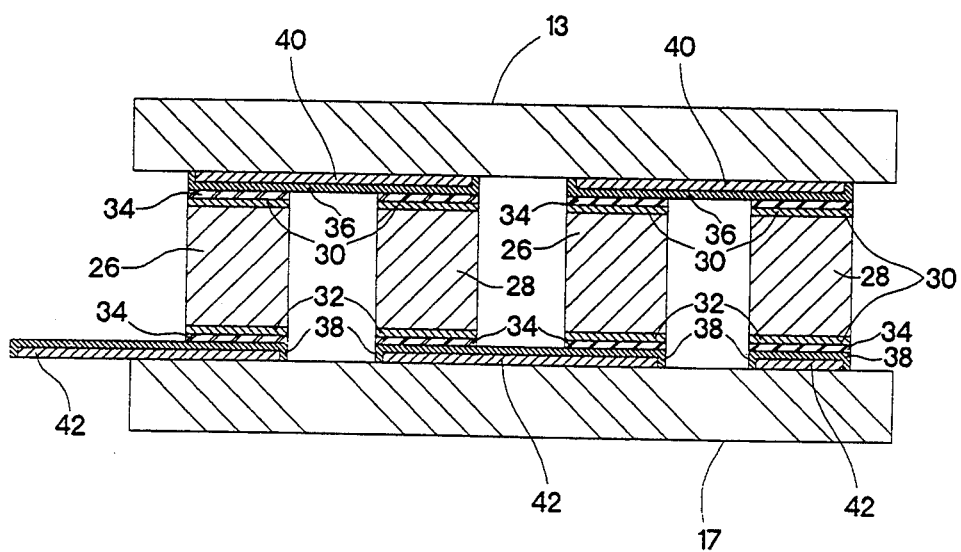
FIG. 3 is a cross-sectional view of the thermoelectric heat pump taken along line 2—2 of FIG. 2.

The heat pumps 16 (FIG. 2), if more than one is used, are identical in construction. Thus, only one heat pump need be described. The improved heat pump 16 includes an array of thermoelectric legs 26 and 28 of n-type and p-type semiconductor material. The legs 26 of n-type material and the legs 28 of p-type material are arranged in rows and columns of alternatively placed n-type and p-type legs. First and second opposing ends of the legs 26 and 28 (FIG. 3), have deposited thereon robust coatings 30 and 32 of conductive material which will form a diffusion barrier and provide a solderable surface. A suitable material for the coatings 30 and 32 is, for example, flame spray or arc spray nickel. The thickness of the robust nickel coatings 30 and 32 is from 1.0 to 3.5 mils. The coatings 30 and 32 are then connected by connector means 34 to second conductive platings 36 and 38 formed on conductive tab metallizations 40 and 42. The connector structure 34 is a thermomechanical fatigue resisting solder for thermoelectric cooler applications.

The solder is hereinafter described in greater detail. The platings 36 and 38 and the conductive tab metallizations 40 and 42 are, respectively, nickel and copper. The thickness of the nickel platings 36 and 38 is from about 20 to 400 microinches and the thickness of the copper conductive tab metallizations 40 and 42 is from about 5 to 15 mils.

The thermomechanical fatigue resisting solder of the connector structure 34 is preferably either a SnAgCd or SnAgIn solder which is about 95.5 weight percent Sn, 3.5 weight percent Ag, and 1.0 weight percent Cd or In. In either case, the solder is non-eutectic with a melting temperature range of about 220°-223.9° C.

Although considerable effort has been made in the electronic industry to understand solder mechanics including thermomechanical fatigue in solder materials, considerably less effort has been made with respect to thermoelectric devices. With respect to electronic devices which include soldering components to mother boards, the research to date has been performed to satisfy three temporal needs: First, Immediate: Engineering Predictions of Solder Joint Lifetimes. This work is based on engineering results, not fundamental understanding. Second, Longer Term: Solder Joint Lifetime Prediction Based on Fundamental Understanding. These results need to be more accurate for lifetime prediction and consequent design purposes. However, much more fundamental metallurgical information is needed before this type of predictive modeling can be performed. Third, Long Term: Alloy Development of Solders for Improved Thermomechanical Fatigue Behavior. Based upon the fundamental metallurgical knowledge and understanding developed for solders under conditions of thermomechanical fatigue, new solder alloys can be developed that have improved lifetimes over solders currently in use. Those persons desiring more information are referred to "Solder Mechanics-A State of the Art Assessment" by D.R. Frear, W.B. Jones, K.R. Kinsman, copyrighted 1991 by TMS, and in particular Chapter 5 which indicates what is known, what is not well understood, and what further work is needed to develop the framework of fundamental metallurgical behavior of solder joints in thermomechanical fatigue so that the previously mentioned three needs can be satisfied.

For comparing improvements made in subsequent developments of thermoelectric heat pumps, a typical 183° solder, thermoelectric heat pump, as described in Example 1, was tested using an accelerated test procedure which included continuously cycling through a temperature cycle from about 0° C. to 100° C. and back to 0° C. at a ramp rate of about 1° C./sec. The number of cycles to failure of the heat pump were counted and divided by itself to establish a 1x baseline for comparing the improvement in cycles made in subsequent or known or both developments in thermoelectric heat pumps. The failure of the heat pump is when the device shorts out because of joint failure. Various heat pumps with different configurations and solders were tested to failure using the same test procedure as for Example 1, the number of temperature cycles to failure counted and divided by the number of cycles to failure of the heat pump of Example 1 to determine their corresponding "x" improvement values. Thus, the testing of the heat pumps of Examples 2 and 3 showed a 100x improvement over the typical heat pump of Example 1.

EXAMPLES

Example 1. To establish a 1x baseline for the number of cycles to failure of a joint for improvement determinations a typical ceramic thermoelectric cooler was tested using the accelerated test procedure to achieve a specified failure. The typical ceramic thermoelectric cooler included 40 mm square ceramics having 256 thermoelectric legs. The thermoelectric legs have nickel plated diffusion barrier ends soldered with 183° C. solder to nickel plated diffusion barrier plates of nickel plated copper conductor tabs. The 183° C. solder comprises SnPb–Eutectic (63%, 37% by weight composition).

After establishing the baseline, numerous thermoelectric coolers with different configurations and solders were tested including: a. various cooler top ceramic sizes; b. various solders; c. various cooler sizes (top and base); and, d. thermoelement geometry. The failed devices were evaluated to determine the mode of failure.

The results of the testing demonstrated that: a. dicing the top ceramic into four smaller pieces resulted in about a 5x improvement in the number of cycles to failure over the number established as the baseline; b. dicing the top ceramic into 16 smaller pieces resulted in approximately a 9x improvement over the number of number of cycles to failure of a joint established as the baseline; c. coolers containing no diffusion barrier and BiSn solder (138° C.) resulted in a 6x improvement over the number of cycles to failure of a joint established as the baseline; and, d. four smaller coolers that were thermoelectrically equivalent to a larger cooler resulted in about a 17x improvement in the number of cycles to failure of a joint established as a baseline.

Failure analyses of the nickel plated diffusion barrier type thermoelectric coolers consistently indicated their failures to occur at the interface of the diffusion barrier and thermoelectric material. The provision of a more robust diffusion barrier with 183° C. solder resulted in a 4x improvement over the number of cycles to failure of a joint established as a baseline. Failure analysis indicated that the failure mode shifted from the diffusion barrier/thermoelectric material interface to the solder. The robust nickel diffusion barriers are obtained through thermal application of the nickel to the ends of the thermoelectric elements using, for example, arc spraying or plasma deposition techniques.

Example 2. In this example, robust nickel diffusion barriers were used and the 183° C. SnPb solder used in Example 1 was replaced by a solder consisting essentially of about 95 weight percent Sn, 3.5 weight percent Ag, and 1.5 weight percent In and the accelerated test run. The test results showed a 100x improvement over the number of number of cycles to failure of a joint established for the baseline heat pump design.

Example 3. In this example, the robust nickel diffusion barriers were used and the SnPb solder of Example 1 was replaced by a solder consisting of about 95.5 weight percent Sn, 3.5 weight percent Ag, and 1.0 weight percent Cd and the accelerated test run. The test results showed a 100x improvement over the number of cycles to failure of a joint established for the baseline design heat pump.

Although the solders of Examples 2 and 3 are non-eutectic, the melting temperature range is so narrow that no detrimental effect on the joint results from the use of either solder.

It will be readily apparent to those persons skilled in the art of thermoelectric coolers that the application of the configuration improvements mentioned in example 1 will further enhance the long time life of the device. It will also be appreciated that the materials of the solder might be hazardous to the persons making and using the solders and that adequate safeguards should be used in practicing this invention.

Although several embodiments of the invention have been described, it will be apparent to a person skilled in the art that various modifications to the details thereof shown and described may be made without departing from the scope of this invention.

What is claimed is:

1. A thermoelectric heat pump for a thermal cycler comprising:

first and second type thermoelectric legs;

tin-silver-indium or tin-silver-cadmium bonding means connected to the first and second type thermoelectric legs being cycled alternately between cold and hot temperatures of about 0° C. up to about 100° C. at a ramping rate of about 1° C. per second;

conductive tab means attached to the bonding means for connecting the legs in series to form a thermocouple, and insulator means connected to the conductive tab means for preventing shorts when the thermoelectric heat pump is connected to a sample holder of a thermal cycler.

2. A thermoelectric heat pump according to claim 1 wherein the solder is about 95 weight percent tin, 3.5 weight percent silver, and 1.5 weight percent indium.

3. A thermoelectric heat pump according to claim 1 wherein the solder is about 95.5 weight percent tin, 3.5 weight percent silver, and 1.0 weight percent cadmium.

4. A thermoelectric heat pump for a thermal cycler or the like comprising:

first and second different type thermoelectric legs having first and second opposing ends, and first and second diffusion barriers formed on the first and second opposing ends;

bonding means operatively formed on the diffusion barriers of the opposing ends of the thermoelectric legs; and conductive tab means attached to the bonding means for connecting the legs in series to form a thermocouple;

said bonding means comprising a tin-silver-indium solder or tin-silver-cadmium solder for providing a thermoelectric heat pump being cycled between low and high temperatures of about 0° C. up to about 100° C. at a rate of 1° C. per second.

5. A thermoelectric cycler comprising:

a sample holder means for holding samples;

an improved thermoelectric heat pump operatively connected to the sample holder means for thermal cycling the sample holder between about 0° C. and 100° C. at a ramping rate of about 1° C. per second, said thermoelectric heat pump including different type thermoelectric legs having first and second opposing ends, diffusion barriers formed on the first and second opposing ends, first and second arrays of conductor tab means, and a bonding means having a tin-silver-indium or a tin-silver-cadmium solder means for connecting the opposing ends of the thermoelectric legs and arrays of conductor tab means with the diffusion barrier material there between for forming thermoelectric couples, the tin-silver-indium or tin-silver-cadmium solder means being resistant to thermal stresses during the thermal cycling at the ramping rate whereby the number of cycles to failure of the thermoelectric heat pump is increased;

a power supply means connected to the thermoelectric couples for supplying a dc current to the thermoelectric couples for producing alternating cold and hot effects; and a controller means connected to the power supply means for controlling the polarity of the dc current applied to the thermoelectric couples, for cycling the thermal cycler and setting the ramping rate.

* * * * *